US005705934A

United States Patent [19]

Drouot

[11] Patent Number: 5,705,934
[45] Date of Patent: Jan. 6, 1998

[54] ANALOG VOLTAGE OUTPUT CIRCUIT

[75] Inventor: Sylvie Drouot, Luynes, France

[73] Assignee: SGS-Thomson Microelectronics S.A., Saint Genis, France

[21] Appl. No.: 379,703

[22] Filed: Jan. 27, 1995

[30] Foreign Application Priority Data

Jan. 28, 1994 [FR] France ................ 94 00952

[51] Int. Cl.$^6$ .................................................. G01R 31/28
[52] U.S. Cl. .................... 324/763; 324/158.1; 324/765
[58] Field of Search .................. 324/763, 765, 324/158.1, 73.1; 327/566, 567; 365/201; 371/21.1, 22.5, 22.6

[56] References Cited

U.S. PATENT DOCUMENTS

| | | | |
|---|---|---|---|
| 4,950,921 | 8/1990 | Takada | 327/566 |
| 5,212,442 | 5/1993 | O'Toole et al. | 324/73.1 |
| 5,349,590 | 9/1994 | Yamada | 324/158.1 |
| 5,498,972 | 3/1996 | Haulin | 324/765 |
| 5,594,359 | 1/1997 | Hashimoto | 324/765 |

FOREIGN PATENT DOCUMENTS 2258925  2/1993  United Kingdom.

Primary Examiner—Ernest F. Karlsen
Attorney, Agent, or Firm—Wolf, Greenfield & Sacks, P.C.; James H. Morris

[57] ABSTRACT

The disclosure relates to an integrated circuit including an internal supply circuit. In the disclosed circuit, an analog voltage output circuit enables the connection of an output of this internal supply circuit to a connection pin of the integrated circuit. It is thus possible to make measurements, without difficulty, of the value of the internal voltage produced. The analog voltage output circuit is arranged in such a way that it is possible, firstly, to enforce a voltage from outside on the output of the internal supply circuit and, secondly, to insulate the output of the internal supply circuit from the connection pin.

13 Claims, 1 Drawing Sheet

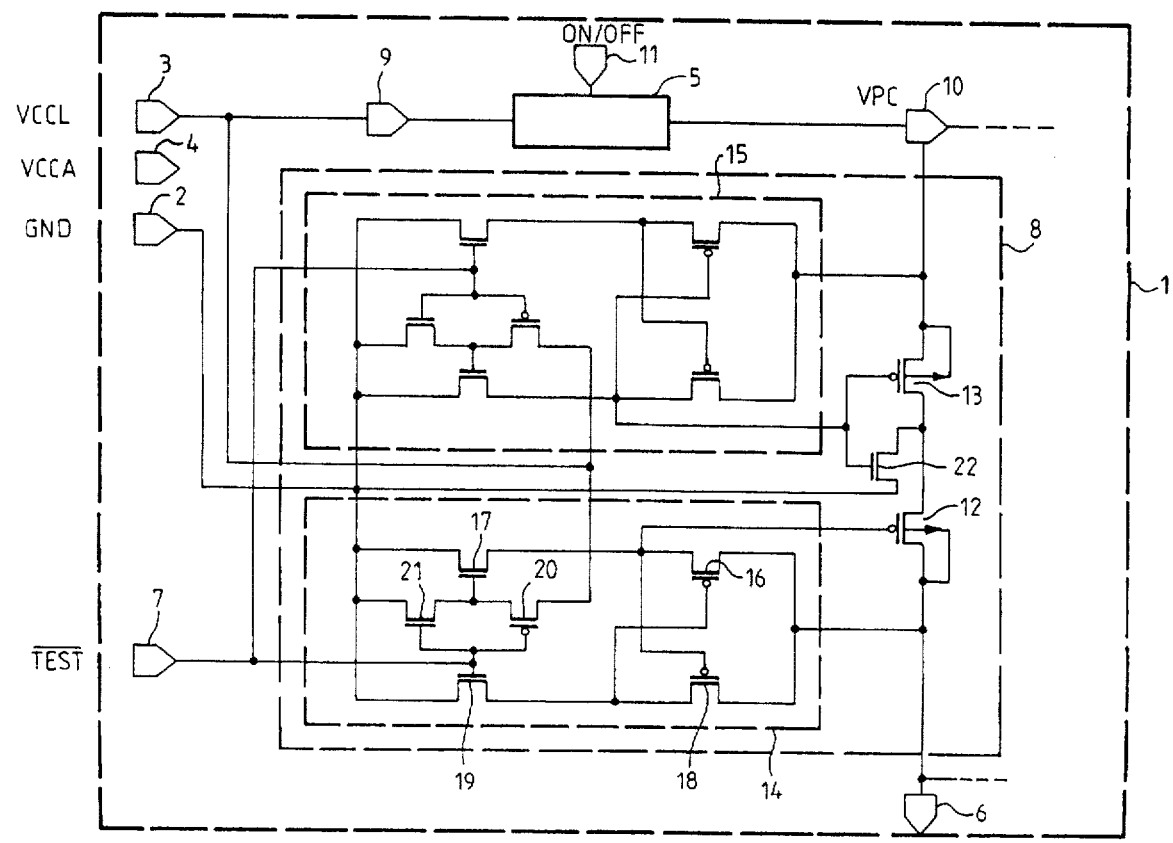

5,705,934

ANALOG VOLTAGE OUTPUT CIRCUIT

BACKGROUND OF THE INVENTION

1. Field of the Invention

The invention relates to integrated circuits. More particularly, it relates to an analog voltage output circuit for analog voltage generated internally in an integrated circuit.

2. Description of the Prior Art

The working and use of certain integrated circuits may lead their designers, for the sake of convenience, to develop supply circuits internal to these integrated circuits.

In a given application requiring several integrated circuits (microprocessors, memories, converters, etc.) assembled on one and the same wafer, a limit is placed on the number of supply circuits that are common to the different circuits and hence external to these different circuits. This makes it possible notably to facilitate the routing of the connection wires connecting these integrated circuits to one another.

In general, the integrated circuits are supplied between at least one ground and one positive analog voltage, for example a 5V voltage, used inter alia to supply the logic circuits. They are sometimes also supplied with a second analog voltage, for example a 15V voltage.

It has therefore become necessary, for convenience, to develop supply circuits internal to certain integrated circuits in order to generate analog voltages needed for the efficient working of these circuits. These analog voltages are generated by means of the supply voltages given to the integrated circuit. If the working of the integrated circuit calls for a higher analog voltage, it is possible, for example, to use voltage raising or voltage pull-up pumping circuits. For example, in the context of the use of an EPROM, it is necessary to have a range of analog supply voltages for the reading, writing and erasure, if necessary, of cells of this memory. The values of these analog voltages vary as a function of the technology used. These analog voltages are not necessarily used in other integrated circuits connected to this memory nor are they present in the same wafer. Consequently, it is not useful or even judicious to provide for one or more supply circuits, external to the memory, aimed solely at giving these analog voltages to this memory.

In order to verify the validity of an integrated circuit that is being developed, different critical elements of this circuit are tested. Any supply voltages generated internally to this integrated circuit generally form part of these critical elements.

Hitherto, the outputs of the internal supply circuits have been measured with probes. Physically, the practice has been to place a metal spike or tip on a conductive track connected to an output of the supply circuit to be tested. Now, a gradual decrease is being witnessed in the minimum dimensions of definition of the integrated circuits. For track dimensions on the order of some micrometers, problems of mechanical and electrical sensitivity arise. The slightest mechanical vibration makes it necessary, in practice, to reposition the metal spike and therefore increases the time needed for the measurement. Furthermore, since this spike must have a width on the order of that of the conductive tracks, it is sensitive to electromagnetic radiation phenomena which distort the result of the measurements. It is therefore difficult or even impossible to test the value or values of the analog voltages delivered by one or more internal supply circuits.

It has therefore appeared to be necessary to make output circuits for the analog voltages in order to test the value of these analog voltages on connection pins of the integrated circuits.

Apart from the fact that this entails the use of additional space it necessitates the dedicating of at least one connection pin of the integrated circuit to the output of the analog voltage or voltages to be measured. Now, the number of connection pins of the integrated circuit must be limited in order to limit its dimensions. Furthermore, a testing output of an internal supply is used in the development stage and is not designed to be used by an ultimate user. This ultimate user has little interest in using an integrated circuit with one or more connections that cannot be used for his application.

It is possible that, during development, a dysfunction may be observed in a part of the integrated circuit connected to an internal supply circuit. It is then appropriate to carry out a test in order to find out whether the supply circuit truly gives the expected analog voltage. In the event of a negative response, it is always useful to ascertain the reaction of the integrated circuit if the desired analog voltage is given to this circuit. It would therefore appear to be advantageous to be able to impose the expected analog voltage from the exterior.

Given what has been stated here above, the aim of the present invention is to propose a test circuit that fulfills three functions:

the possibility of testing the value or values of one or more analog voltages generated by supply circuits internal to an integrated circuit, this value or these values being accessible on one or more connection pins of the integrated circuit;

the possibility of enforcing this value or values, being externally generated, on the integrated circuit, this value or these values being applied to connection pins of the integrated circuit; and the possibility, during normal operation, of isolating the internal supply circuits of the connection pins used for the measurement or the enforcing of an analog voltage.

The last function described enables the use, if necessary, of a connection pin used for this test (measurement or enforcing) for another use in normal operation. Thus, the presence of connection pins that cannot be used in the customer's version (designed for sale) of the integrated circuit is avoided.

SUMMARY OF THE INVENTION

According to the invention, these aims are achieved by an integrated circuit comprising reference terminals in order to respectively give one or more basic voltages and one or more supply voltages, one or more internal supply circuits comprising at least one internal input terminal to receive a supply voltage, at least one internal output terminal to deliver an internal supply voltage, and at least one control terminal to receive an on/off pulse signal, a test terminal and a test control terminal, the test terminal being capable of receiving or giving a test voltage and said test control terminal being capable of receiving a test control pulse signal, an analog voltage output circuit connected respectively to the output terminal, the test terminal, the test control terminal, one or more reference terminals, this analog voltage output circuit comprising insulation transistors series-connected between the output terminal and the test terminal and one or more switching circuits, wherein a first switching circuit connects the control gate of a first insulation transistor respectively to the test terminal when the test control signal is in a first state, to a reference terminal when the test control signal is in a second state.

In a preferred embodiment, a second switching circuit connects the control gate of a second insulation transistor respectively to the internal output terminal when the test control signal is in its first state, and to a reference terminal when the test control signal is in a second state.

Thus, the circuit according to the invention enables, firstly, the insulating of the internal output terminal and the test terminal when the test control signal is in its first state and, secondly, the connection of the internal output terminal and the test terminal when the test control signal is in a second state.

To insulate the internal output terminal and the test terminal, the gates of the insulation transistors are connected to these terminals. Thus, whatever may be the voltage values present at these terminals, these transistors are off.

Advantageously, the first and the second insulation transistors are P type transistors. These transistors have a twofold advantage. Firstly, the voltage drops between the output of the internal supply circuit and the test terminal are minimized. Secondly, the connection of the internal output terminal and the test terminal can be controlled by placing their control gate at the ground. It is therefore possible to easily enforce an external voltage on the output terminal whatever may be the voltage present at the internal output terminal.

Since these transistors are series-connected, the midpoint of these transistors will be advantageously connected to the drain of an N type transistor whose source is connected to a reference terminal and whose control gate is connected to the control gate of the second insulation transistor. Thus, by furthermore connecting the substrates of the insulation transistors respectively to the test terminal and to the output terminal, perfect insulation is ensured between said terminals.

BRIEF DESCRIPTION OF THE DRAWINGS

Other features and advantages of the present invention shall appear from the following detailed description of a preferred embodiment, given by way of example that in no way restricts the scope of the invention.

FIG. 1 illustrates an integrated circuit including an analog voltage output circuit according to the invention.

DETAILED DESCRIPTION

In FIG. 1, an integrated circuit 1 has:
reference terminals 2, 3 and 4 to respectively give one or more basic voltages and one or more supply voltages;
an internal supply circuit 5;
a test terminal 6 and a test control terminal 7;
an analog voltage supply circuit 8.

The integrated circuit 1 has three reference terminals 2, 3 and 4. These reference terminals give one or more voltages to the integrated circuit 1. The term "supply" is understood to mean that these voltages are generated by supply circuits external to the integrated circuit 1o The reference terminals 2, 3 and 4 are therefore, in practice, connection pins of the integrated circuit 1.

The reference terminal 2 gives a so-called basic voltage GND. In practice, it is a ground.

The reference terminals 3 and 4 respectively give a first supply voltage VCCL and a second supply voltage VCCA.

In the example considered, the first supply voltage VCCL corresponds to a voltage supplying logic circuits. In practice, this logic supply voltage VCCL has a level of 3 to 5 volts. The second supply voltage VCCA corresponds to an analog voltage having a level ranging, for example, from 12 to 15 volts. This type of analog supply VCCA is used typically for the working of EPROM type memories which require high voltages (up to 20 volts), for example for the programming and erasure (in the case of EEPROMs) of the cells of these memories. Indeed, it is simpler and above all more economical to raise a voltage by a small value, for example from 12 volts to 17 volts than to raise it by a high value, for example from 5 volts to 17 volts.

It is also possible of course to consider an exemplary circuit supplied by only one external supply voltage.

The internal supply circuit 5 includes:
an internal input terminal 9 to receive a supply voltage;
an internal output terminal 10 to deliver an internal supply voltage VPC; and
a control terminal 11 to receive an ON pulse signal.

Only one internal supply circuit 5 is considered. However, depending on voltage values needed for the working of the integrated circuit 1, several internal supply circuits could be included.

The composition and operation of the internal supply circuit 5 shall not be discussed exhaustively in the rest of the description. Conventionally, for example, Schenkel type pumping circuits are used.

Typically, the internal supply circuit 5 receives an external supply circuit VCCL or VCCA at its internal input terminal 9. It uses this external supply voltage to generate an internal supply voltage VPC. This internal supply voltage VPC is given to the rest of the integrated circuit 1 at its internal output terminal 10. The term "internal" is understood to mean not accessible from the exterior of the integrated circuit 1, as opposed to connection pins which, for their part, are accessible from the exterior.

The control circuit 11 receives an binary control signal on/off. This signal on/off is used to turn the internal supply circuit on (state ON) or to turn it off (state OFF). The presence of an on/off signal such as this is not obligatory. A system could be conceived of where the internal supply circuit 5 works constantly. However, it is functionally useful to have a control signal such as this available. Indeed, it is sought to have the ability to enforce a voltage generated externally to the integrated circuit instead of the supply voltage VPC. It is recommended, in this case, to make it possible to isolate the internal output terminal 10 of the internal supply circuit 5 in order to prevent any short circuiting between the internal supply circuit 5 and an external supply circuit. Furthermore, more generally, it is advantageous to limit the consumption of the integrated circuit 1. It is therefore generally sought to cut off the consumption of parts of this circuit which are not used.

Hereinafter in the description, it shall be assumed that GND equals 0V, VCCL equals 5V, VCCA equals 12V and VPC equals 7V. It shall be assumed that VPC is generated from VCCL and that the internal input terminal 9 is connected to the logic supply terminal 3.

The test terminal 6 may receive or give a test voltage. This test voltage 6 is a connection pin of the integrated circuit 1. It is by connecting to this test terminal 6 that it is possible to measure the supply voltage VPC or impose a voltage on the internal output terminal 10 of the internal supply circuit 5.

The test control terminal 7 may receive a test control pulse signal/TEST. The test control pulse signal/TEST may assume two values corresponding in practice to VCCL and GND. These voltage values correspond to logic states 0 and 1. /TEST=0 corresponds to the voltage value GND. /TEST=1 corresponds to the voltage value VCCL. When the test control signal/TEST is at the logic 0 value, it is possible to measure or enforce a voltage on the internal output terminal 10. When the test control signal/TEST is at logic 1, the internal output terminal 10 is insulated from the test terminal 6.

In practice, the test control terminal 7 is either a connection pin of the integrated circuit 1 or an internal terminal. If it is a connection pin, it can be used, if necessary, for another purpose in the customer's version. If it is an internal terminal, the test control signal/TEST is then generated internally with respect to the integrated circuit 1. Conventionally, it is the second approach that is preferred, the signal/TEST being produced from a code sequence given to the integrated circuit.

The analog voltage output circuit 8 is connected respectively to:

the internal output terminal 10;

the test terminal 6;

the test control terminal 7; and the reference terminals 2 and 3.

This analog voltage output circuit 8 has insulation transistors 12 and 13 series-connected between the internal output terminal 10 and the test terminal 6. It also has switching circuits 14 and 15.

A first switching circuit 14 connects the control gate of a first insulation transistor 12 to either:

the test terminal 6 when the test control signal/TEST is at 1; or the base terminal 2 when the test control signal/TEST is at 0.

This first switching circuit 14, made in a standard way, has:

two inputs;

one output connected to either of the inputs; and one control.

Two transistors 16 and 17, which are respectively P type and N type transistors, are series-connected between the test terminal 6 and the base terminal 2. The test terminal 6 and the base terminal 2 are the inputs of the switching circuit 14. The source of the P transistor 16 is connected to the test terminal 6. The source of the N transistor 17 is connected to the base terminal 2. The drains of these two transistors 16 and 17 are connected to each other and constitute the output of the switching circuit 14, which is connected to the control gate of The first insulation transistor 12.

The first switch transistor 14 has two other transistors 18 and 19, respectively P and N type transistors, having their sources mounted similarly to those of the first transistors 16 and 17, and having their drains similarly connected to each other.

The control gate of the first P type transistor 16 is connected to the drain of the second P type transistor 18. Similarly, the control gate of the second P type transistor 18 is connected to the drain of the first P type transistor 16.

The control gate of the second N type transistor 19 is connected to the test control terminal 7. The control gate of the first N type transistor 17 is also connected in the same way by means of an inverter which conventionally has two opposite types of transistors 20 and 21 series-connected between the logic supply terminal 3 and the base terminal 2. The control of the switching circuit 14 thus depends on the test control signal/TEST.

A second switching circuit 15 connects the control gate of a second insulation transistor 13 to either:

the internal output terminal 10 when the test control signal/TEST is at 1; or the base terminal 2 when the test control signal/TEST is at 0.

This second switching circuit 15 is made in an equivalent way to that of the first switching circuit 14. However, the inputs of this circuit are the internal output terminal 10 and the base terminal 2, and not the test terminal 6 and the base terminal 2.

The first insulation transistor 12 is a P type transistor whose source and substrate are connected to the test terminal 6.

The second insulation transistor 13 is a P type transistor whose source and substrate are connected to the internal output terminal 10 and whose drain is connected to the drain of the first insulation transistor 12.

The P type transistors will be preferred for the precision of the measurement. Indeed, N type transistors mounted as indicated above would induce voltage drops (threshold effect and substrate effect) that could go up to 2 volts per transistor. The value of the voltage measured would therefore be relatively distant from that of the voltage actually present at the internal output voltage 10. For example, 4 volts will be measured instead of 7 volts. To minimize these losses, it is possible to envisage the connection of the control gates of these transistors to a supply terminal giving a higher supply voltage, for example VCCA (12 volts). This would complicate the layout diagram, and this is not desirable. Besides, it would still have to be made certain that the voltage VPC could never exceed said supply voltage VCCA.

The test circuit 8 insulates the internal output terminal 10 and the test terminal 6 when the test control signal/TEST is at 1. Indeed, the control gates of the insulation transistors 12 and 13 are then connected to their sources. They are therefore turned off, irrespectively of the voltages present at the terminals 10 and 6.

The analog voltage output circuit 8 connects the internal output terminal 10 and the test terminal 6 when the test control signal/TEST is at 0. Indeed, the control gates of the insulation transistors 12 and 13 are then connected to the base terminal 2.

In this case, it will be possible without difficulty to insulate the internal supply circuit 5 from its internal output circuit 10. Indeed, the fact of turning off or turning on the second insulation transistor 13 is independent of the value of the internal supply voltage VPC. In the former case, the control gate and the source of this transistor are connected. In the latter case, the control gate of this transistor is connected to the base terminal 2 provided that VCCL is truly positive. If a voltage needs to be enforced on the test terminal 6, it will be possible therefore to insulate the internal supply circuit 5 and the internal output terminal 10.

Advantageously, the drains of the insulation transistors 12 and 13 will be connected to the drain of an N type transistor 22 whose source is connected to the base terminal 2 and whose control gate is connected to the control gate of the second insulation transistor 13. Perfect insulation, in normal operation, is then provided between the internal output terminal 10 and the test terminal 6. Indeed, the substrates of the insulation transistors 12 and 13 are then definitely at a potential greater than or equal to the potentials of the sources and drains of these transistors. There is thus prevented the appearance of leaks which would be due to a floating potential at the drains of the insulation transistors 12 and 13.

With regard to the ratio between the width of the control gate and the length of said gate, expressed in micrometers, the following values could be taken for example:

30/6 for the first insulation transistor 12; and

15/3 for the second insulation transistor 13.

A preferred embodiment of the invention has been described here above.

This embodiment is not restrictive. In particular, the analog voltage output circuit could be duplicated in order to test different internal supply circuits with the number of test control signals also being duplicated. There would be no difficulty in connecting these circuits to one and the same test terminal. Indeed, in taking care not to place more than one test control signal at 0 at time, it is certain that these circuits would be insulated from one another.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit comprising:
   reference terminals to respectively give at least one basic voltage and at least one supply voltage,
   an internal supply circuit comprising at least one internal input terminal to receive a supply voltage, at least one internal output terminal to deliver an internal supply voltage, and at least one control terminal to receive an on/off pulse signal,
   a test terminal being capable of receiving and giving a test voltage,
   a test control terminal being capable of receiving a test control signal,
   an analog voltage output circuit connected respectively to the internal output terminal, the test terminal, the test control terminal, at least one reference terminal, the analog voltage output circuit including insulation transistors series-connected between the internal output terminal and the test terminal and at least one switching circuit,
   wherein a first switching circuit connects the control gate of a first insulation transistor to the test terminal when the test control signal is in a first state, and to a reference terminal when the test control signal is in a second state.

2. A circuit according to claim 1, wherein a second switching circuit connects the control gate of a second insulation transistor to the internal output terminal when the test control signal is in its first state, and to a reference terminal when the test control signal is in its second state.

3. A circuit according to claim 2, wherein the analog voltage output circuit operates to insulate the internal output terminal and the test terminal when the test control signal is in a first state, and operates to connect the internal output terminal and the test terminal when the test control signal is in a second state.

4. A circuit according to claim 1, wherein the first insulation transistor is a P type transistor whose source and substrate are connected to the test terminal.

5. A circuit according to claim 2, wherein the second insulation transistor is a P type transistor whose source and substrate are connected to the internal output terminal and whose drain is connected to the drain of the first insulation transistor.

6. A circuit according to claim 5, wherein the drains of the insulation transistors are connected to the drain of an N type transistor whose source is connected to a reference terminal and whose control gate is connected to the control gate of the second insulation transistor.

7. A circuit according to claim 2, wherein the ratio between the width of the control gate and the length of said gate, expressed in micrometers, is 30/6 for the first insulation transistor, and 15/3 for the second insulation transistor.

8. The circuit according to claim 1, wherein said first switching circuit includes:
   a first pair of switching transistors series connected between said test terminal and said reference terminal, wherein drains of said first pair of switching transistors are connected together and connected to said first insulating transistor.

9. The circuit according to claim 8, wherein said first switching circuit further includes:
   a second pair of switching transistors series connected between said test terminal and said reference terminal, wherein drains of said second pair of switching transistors are connected together and connected to a control gate of one of said first pair of switching transistors, wherein a control gate of one of said second pair of switching transistors is connected to the drains of said first pair of switching transistors, and wherein control gates of a second of said first pair of switching transistors and of said second pair of switching transistors are connected to said test control terminal.

10. The circuit according to claim 9, further comprising an inverter connecting the gate of said second of said first pair of switching transistors is connected to said test control terminal.

11. The circuit according to claim 2, wherein said second switching circuit includes:
    a third pair of switching transistors series connected between said internal output terminal and said reference terminal, wherein drains of said third pair of switching transistors are connected together and connected to said second insulating transistor.

12. The circuit according to claim 11, wherein said second switching circuit further includes:
    a fourth pair of switching transistors series connected between said internal output terminal and said reference terminal, wherein drains of said fourth pair of switching transistors are connected together and connected to a control gate of one of said third pair of switching transistors, wherein a control gate of one of said fourth pair of switching transistors is connected to the drains of said third pair of switching transistors, and wherein control gates of a second of said third pair of switching transistors and of said fourth pair of switching transistors are connected to said test control terminal.

13. The circuit according to claim 12, further comprising an inverter connecting the gate of said second of said third pair of switching transistors to said test control terminal.

* * * * *